(12) United States Patent
Millebjer (10) Patent No.: US 11,522,374 B2
(45) Date of Patent: Dec. 6, 2022

(54) BATTERY SAVING SYSTEM AND ELECTRICALLY POWERED MOBILITY DEVICE COMPRISING THE SAME

(71) Applicant: PERMOBIL AB, Timrä (SE)

(72) Inventor: Daniel Millebjer, Bergeforsen (SE)

(73) Assignee: PERMOBIL AB, Timrä (SE)

( * ) Notice: Subject to any disclaimer, the term of this patent is extended or adjusted under 35 U.S.C. 154(b) by 168 days.

(21) Appl. No.: 17/050,277

(22) PCT Filed: Mar. 19, 2019

(86) PCT No.: PCT/EP2019/056897
§ 371 (c)(1),
(2) Date: Oct. 23, 2020

(87) PCT Pub. No.: WO2019/206525
PCT Pub. Date: Oct. 31, 2019

(65) Prior Publication Data
US 2021/0234382 A1    Jul. 29, 2021

(30) Foreign Application Priority Data
Apr. 27, 2018 (EP) ................... 18169884

(51) Int. Cl.
*H02J 7/00* (2006.01)
*G01R 31/387* (2019.01)
(Continued)

(52) U.S. Cl.
CPC .......... *H02J 7/0031* (2013.01); *G01R 31/387* (2019.01); *G01R 31/3828* (2019.01); *G01R 31/379* (2019.01)

(58) Field of Classification Search
CPC .. H02J 7/0031; H02J 7/00302; H02J 7/00306; H02J 9/007; H02J 2207/10;
(Continued)

(56) References Cited

U.S. PATENT DOCUMENTS 7,542,250 B2 *  6/2009  Premerlani ........ H01H 59/0009
                                                361/13
7,548,041 B2 *  6/2009  Zemke ................. H02J 7/0068
                                                320/133

(Continued)

OTHER PUBLICATIONS

Electronics Hub, Administrator, Adjustable Timer Circuit Diagram with Relay output, Mar. 21, 2016, pp. 1-2 (Year: 2016).*

(Continued)

*Primary Examiner* — M Baye Diao
(74) *Attorney, Agent, or Firm* — Michael Best & Friedrich LLP (57) ABSTRACT

A battery saving system (1) for an electrically powered mobility device (13) comprising a battery (15) and a drive control system (16) configured to be powered by the battery, wherein the battery saving system (1) comprises: a current monitoring circuit (3) configured to monitor a load current provided by the battery (15), wherein the current monitoring circuit (3) is configured to determine whether a load current magnitude is below a load current threshold level, a timer circuit (7) having a counter configured to successively count as long as the load current magnitude level is below the load current threshold level, and to reset the counter in the event that the load current level magnitude exceeds the current threshold level, and a disconnecting switch (9) configured to be operated between an open state and a closed state, wherein the timer circuit (7) is configured to trigger the disconnecting switch (9) to obtain the open state when the counter has reached a predetermined number to thereby disconnect the battery (15) from the drive control system (16).

15 Claims, 3 Drawing Sheets (51) Int. Cl.
    *G01R 31/3828*     (2019.01)
    *G01R 31/379*     (2019.01)

(58) Field of Classification Search
    CPC .... H02J 7/0032; H02J 9/005; G01R 31/3828;
                              G01R 31/387; G01R 31/379
    USPC ........................................................ 320/134
    See application file for complete search history.

(56) References Cited

U.S. PATENT DOCUMENTS

| | | | |
|---|---|---|---|
| 9,075,090 B2 * | 7/2015 | Zimmerman | G01R 19/16542 |
| 10,498,149 B2 * | 12/2019 | Shibata | H02J 7/0026 |
| 10,802,078 B2 * | 10/2020 | Tamegai | G01R 19/16542 |
| 10,886,738 B2 * | 1/2021 | Abe | H02J 1/06 |
| 2011/0169341 A1 | 7/2011 | Manning | |
| 2011/0267728 A1 | 11/2011 | Guillot et al. | |
| 2012/0013189 A1 | 1/2012 | Jenkins | |
| 2016/0218554 A1 | 7/2016 | Hatipoglu et al. | |
| 2017/0190261 A1 | 7/2017 | Cheng | |
| 2018/0351359 A1 * | 12/2018 | Abe | G01R 31/42 |

OTHER PUBLICATIONS

International Search Report and Written Opinion for Application No. PCT/EP2019/056897 dated May 8, 2019 (11 pages).
International Preliminary Report on Patentability for Application No. PCT/EP2019/056897 dated Jul. 20, 2020 (7 pages).
China National Intellectual Property Administration First Office Action for Application No. 201980028553.9 dated May 30, 2022 (19 pages including English translation).

* cited by examiner

BATTERY SAVING SYSTEM AND ELECTRICALLY POWERED MOBILITY DEVICE COMPRISING THE SAME

CROSS REFERENCE TO RELATED APPLICATIONS

This application is a national phase filing of International Patent Application No. PCT/EP2019/056897, entitled "BATTERY SAVING SYSTEM AND ELECTRICALLY POWERED MOBILITY DEVICE COMPRISING THE SAME" and filed on Mar. 19, 2019, which claims priority to European Patent Application No. 18169884.6 entitled "BATTERY SAVING SYSTEM AND ELECTRICALLY POWERED MOBILITY DEVICE COMPRISING THE SAME" and filed on Apr. 27, 2018, the entire contents of each application is herein incorporated by reference in its entirety.

TECHNICAL FIELD

The present disclosure generally relates to electrically powered mobility devices.

BACKGROUND

Electronic components usually consume energy even when they are switched off. Depending on the battery size and the energy consumption while the system is switched off, there is a risk that the battery/batteries will be drained when the device containing the battery/batteries is not in use.

For battery powered mobility devices that are not used on a daily basis this could become a major problem. In particular, it could be a problem for mobility devices of the kind where the idle current of a drive control system that controls the operation of the device is high is relation to the capacity of the battery/batteries. The situation is worsened in case the mobility device is left unused for a longer period of time without prior charging. This could result in a total battery drain, especially for batteries such as lead acid batteries which do not comprise any internal electronics. With lead acid batteries there is a risk of sulfation. Sulfation gradually degrades the battery/batteries, resulting in that they lose capacity. This risk increases when batteries are deeply discharged, i.e. when batteries are drained below the lowest recommended voltage.

SUMMARY

An object of the present disclosure is to provide a battery saving system which solves, or at least mitigates problems of the prior art.

There is hence according to a first aspect of the present disclosure provided a battery saving system for an electrically powered mobility device comprising a battery and a drive control system powered by the battery, wherein the battery saving system comprises: a current monitoring circuit configured to monitor a load current provided by the battery, wherein the current monitoring circuit is configured to determine whether a load current magnitude is below a load current threshold level, a timer circuit having a counter configured to successively count as long as the load current magnitude is below the load current threshold level, and to reset the counter in the event that the load current magnitude exceeds the load current threshold level, and a disconnecting switch configured to be operated between an open state and a closed state, wherein the timer circuit is configured to trigger the disconnecting switch to obtain the open state when the counter has reached a predetermined number to thereby disconnect the battery from the drive control system.

With an electrically powered mobility device is meant a mobility aid comprising an electric motor. Examples of such electrically powered mobility devices are mobility aids for small children with disabilities, hospital beds and lifting aids. The electric motor of devices of this type may only be used seldom, as the device does not necessarily form part of everyday life for its user. Such devices may have a drive control system which draws an idle current which is high in relation to the capacity of the battery/batteries. A further example of an electrically powered mobility device is an electrically powered wheelchair.

The battery saving system automatically disconnects/separates the battery from a drive control system and prevents the battery from being drained when not used. This is accomplished by monitoring the load current together with the timer circuit that allows the battery saving system to be idle until the counter reaches the predetermined number before disconnecting the battery from the drive control system with the disconnecting switch. The risk of sulfation may thereby be reduced.

One embodiment comprises a voltage monitoring circuit configured to monitor a battery voltage, wherein the current monitoring circuit is configured to monitor a charging current, and wherein the timer circuit is configured to reset the counter as long as at least one of a) the battery voltage is above a predetermined voltage threshold level and b) a charging current magnitude is above a predetermined charging current threshold level.

The counter is hence constantly reset as long as charging is in progress and one of the conditions a) and b) is fulfilled, enabling charging for any given length of time without disconnection of the battery from the battery charger.

The charging current can be differentiated from the load current since the two currents have opposite signs.

According to one embodiment the counter is configured to be activated when the battery voltage is below the predetermined voltage threshold level and the charging current magnitude is below the predetermined charging current threshold level.

According to one embodiment the disconnecting switch is configured to be set in the open state to disconnect the battery when the charging current magnitude is above a predetermined allowed charging current level.

According to one embodiment the predetermined allowed charging current level is higher than the maximum recommended battery charging current.

According to one embodiment the disconnecting switch is configured to be set in the open state to disconnect the battery when the battery voltage is above a predetermined allowed voltage level.

Thus, the battery is protected against overcharging. This may prolong the lifetime of the battery by reducing the risk of gas being released to the atmosphere during battery gassing. If too much gas is lost, the battery will dry out, reducing the battery lifetime. At the same time the risk of explosion is reduced.

According to one embodiment the predetermined allowed voltage level is higher than the maximum recommended battery charging voltage.

One embodiment comprises a button configured to enable setting the disconnecting switch in the closed state and to reset the counter.

One embodiment comprises a power supply configured to be powered by the battery and configured to power the timer circuit, wherein the disconnecting switch is configured to disconnect the power supply from the battery when the disconnecting switch is in the open state, and wherein the button has a mechanical switch configured to be set in a closed position when the button is actuated, causing the power supply to connect to the battery and power the timer circuit.

The power supply may for example be a power converter, e.g. a DC-DC converter. The power supply may for example be series-connected with the disconnecting switch. The button may for example include a mechanical switch such as a momentary mechanical switch, which is parallel connected with the disconnecting switch. By pushing the button, the momentary mechanical switch may be set in a closed position, closing the circuit formed by the battery and the power supply. The power supply will thus be powered by the battery. The button may hence activate the power supply. The power supply may be configured to power the timer circuit. The power supply may be configured to power the current monitoring circuit and/or the voltage monitoring circuit. By activating the power supply, the disconnecting switch may be set in the closed state. For example, the power supply may be configured to power the timer circuit when activated, causing the timer circuit to trigger the disconnecting switch to obtain its closed state. For example, if the disconnecting switch comprises a semiconductor switch, such as a transistor, the timer circuit may send a signal to the semiconductor switch which sets the semiconductor switch in its closed state. The power supply will thus be fed from the battery via the disconnecting switch which is in the closed state. Moreover, the drive control system will be connected to and powered by the battery. The button may for example be a mechanical button, e.g. a push button such as a momentary push button, or a soft button.

There is according to a second aspect of the present disclosure provided a method of prolonging the life of a battery of an electrically powered mobility device comprising a drive control system powered by the battery, comprising: detecting a load current from the battery to the drive control system, determining whether a load current magnitude is below a load current threshold level, counting as long as the load current magnitude is below the load current threshold level, in case the load current magnitude exceeds the load current threshold level, resetting the counter, and operating a disconnecting switch to obtain an open state when the counter reaches a predetermined number to thereby disconnect the drive control system from the battery.

One embodiment comprises, during charging: detecting a battery voltage and a charging current, determining whether the battery voltage is below a predetermined voltage threshold level or the charging current is below a predetermined charging current threshold level, and resetting the counter as long as at least one of a) the battery voltage is above the predetermined voltage threshold level and b) the charging current is above the predetermined charging current threshold level.

One embodiment comprises operating the disconnecting switch to obtain an open state when the charging current magnitude is above a predetermined allowed charging current level to thereby disconnect the battery from a battery charger.

One embodiment comprises operating the disconnecting switch to obtain an open state when the battery voltage is above a predetermined allowed voltage level to thereby disconnect the battery from a battery charger.

There is according to a second aspect of the present disclosure provided a control system for an electrically powered mobility device comprising the battery saving system according to the first aspect. The control system may be a supervisory control system which includes the drive control system. The supervisory control system may include further control functions than those of the drive control system which are directed to drive control. The supervisory control system may for example additionally be configured to control the seating system and any other function not related to drive control.

The control system may be configured to control the operation of the disconnecting switch based on the state of the timer circuit, in particular the counter.

There is according to a third aspect of the present disclosure provided an electrically powered mobility device comprising: a battery, a drive control system, and a battery saving system according to the first aspect.

Generally, all terms used in the claims are to be interpreted according to their ordinary meaning in the technical field, unless explicitly defined otherwise herein. All references to "a/an/the element, apparatus, component, means, etc." are to be interpreted openly as referring to at least one instance of the element, apparatus, component, means, etc., unless explicitly stated otherwise.

BRIEF DESCRIPTION OF THE DRAWINGS

The specific embodiments of the inventive concept will now be described, by way of example, with reference to the accompanying drawings, in which.

DETAILED DESCRIPTION

The inventive concept will now be described more fully hereinafter with reference to the accompanying drawings, in which exemplifying embodiments are shown. The inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art.

Like numbers refer to like elements throughout the description.

Figure 1:
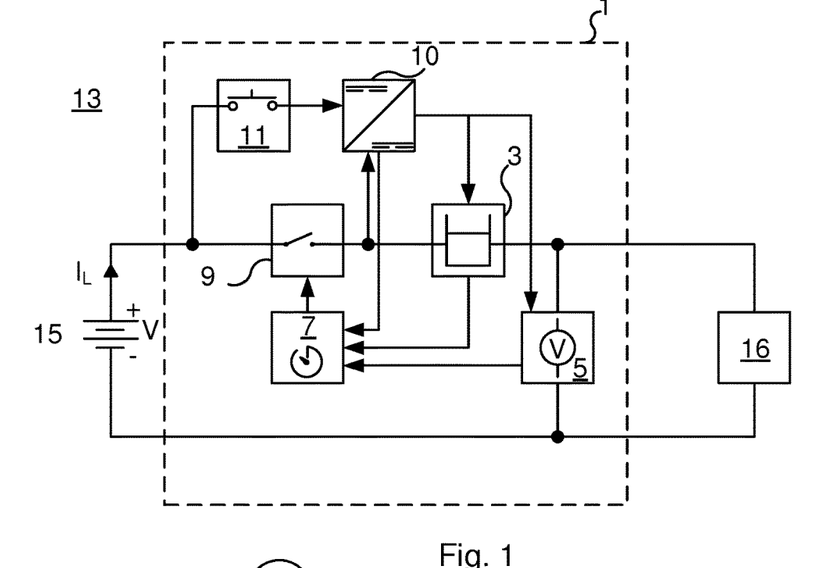
FIG. 1 schematically shows a block diagram of a battery saving system for an electrically powered mobility device connected to a battery and to a drive control system.

FIG. 1 depicts a block diagram of an example of a battery saving system 1. The battery saving system 1 is configured to be used with an electrically powered mobility device comprising a battery 15 and a drive control system 16. In particular, the battery saving system 1 is configured to disconnect the drive control system 16 from the battery 15 in case the battery has been in an idle state for a predetermined amount of time and is not being subjected to charging.

Additionally, the battery saving system 1 is configured to enable charging of the battery 15 for any given time as long as at least one of the charging current and the battery voltage is above a corresponding predetermined limit.

Furthermore, the battery saving system 1 is configured to disconnect a battery charger from the battery 15 in the event that the battery charger provides a charging current or voltage which exceeds predetermined limits. The battery 15 is thereby protected from overcharging.

The exemplified battery saving system 1 comprises a current monitoring circuit 3 and a voltage monitoring circuit 5. The battery saving system 1 furthermore comprises a timer circuit 7 and a disconnecting switch 9 configured to be set in a closed state and an open state. The battery saving system 1 may additionally comprise a button 11, for example a push button or a button of a digital user interface.

The battery saving system may additionally comprise a power supply 10. The power supply 10 may for example be a power converter such as a DC-DC converter. The power supply 10 is configured to power the current monitoring circuit 3, the voltage monitoring circuit 5 and the timer circuit 7.

The power supply 10 may be configured to be fed by the battery 15. The button 11 may include a mechanical switch which normally may be in an open position, and which when the button 11 is pushed may be set in a closed position. The power supply 10 is connected to the battery 15 via the mechanical switch of the button 11. The power supply 10 is also connected to the battery 15 via the disconnecting switch 9. When the disconnecting switch 9 is in the closed state and the mechanical switch is in the open position, the power supply 10 is powered by the battery 15 via the disconnecting switch 9.

When the disconnecting switch 9 is in the open state and mechanical switch is in the open position, the power supply 10 is disconnected from the battery 15.

An electrically driven mobility device 13 comprising the battery saving system 1 may comprise one or more batteries 15 and a drive control system 16. For reasons of simplicity, in the present example a single battery will be assumed although several batteries could alternatively be used. The battery 15 is configured to power the drive control system 16. The battery 15 is a rechargeable battery. The battery 15 may for example be a lead acid battery.

The drive control system 16 may for example include an electric motor and/or electronics for controlling the electric motor and/or user interface electronics for interacting with the electrically driven mobility device 13.

The drive control system 16 generally requires a load current $I_L$ with a certain load current magnitude in order for proper operation. The load current magnitude required may be above a load current threshold. The drive control system normally consumes energy from the battery 15. During charging, a battery charger C may according to one variation instead provide the energy to the drive control system 16.

The current monitoring circuit 3 is configured to measure current flowing from the battery 15, i.e. the load current, and current flowing to the battery, i.e. charging current. The current monitoring circuit 3 may comprise a current sensor.

The voltage monitoring circuit 5 is configured to measure a battery voltage V.

The voltage monitoring circuit 5 may comprise a voltage sensor.

The disconnecting switch 9 is configured to be set in an open state and in a closed state. In the closed state, the disconnecting switch 9 closes the circuit formed by the battery 15, the power supply 10, and the drive control system 16. The load current $I_L$ may thus be fed to the drive control system 16. In the open state, the disconnecting switch 9 opens the circuit formed by the battery 15, the power supply 10, and the drive control system 16. Thus, in the open state, the disconnecting switch 9 disconnects the drive control system 16 from the battery 15. The disconnecting switch 9 furthermore disconnects the power supply 10 from the battery 15. The current monitoring circuit 3, the voltage monitoring circuit 5 and the timer circuit 7 will hence not receive any power in this situation.

By pushing the button 11, a circuit formed by the battery 15 and the power supply 10 is closed. The power supply 10 will thus receive power from the battery 15. The power supply 10 can hence power the current monitoring circuit 3, the voltage monitoring circuit 5 and the timer circuit 7. When the timer circuit 7 is powered up, it sends a signal to the disconnecting switch 9, which sets the disconnecting switch 9 in the closed state. The counter may also be reset.

When the button 11 is released causing the mechanical switch to be set in the open position, the power supply 10 will be in a closed circuit with the battery 15 because the disconnecting switch 9 is in the closed state. This circuit may for example be realised by a parallel connection between the disconnecting switch 9 and the mechanical switch of the button 11. The power supply 10 may be in series-connection with the disconnecting switch 9 and the mechanical switch of the button 11.

The disconnecting switch 9 may be an electronic switch, for example a semiconducting switch such as a transistor. Alternatively, the disconnecting switch 9 may be an electro-mechanical switch such as a relay.

The timer circuit 7 is configured to count based on measurements provided by the current monitoring circuit 3 and in some cases also based on measurements provided by the voltage monitoring circuit 5. In case the timer circuit 7 has counted and reached a predetermined number, the timer circuit 7 is configured to trigger disconnection of the battery 15 from the drive control system 16 via the disconnecting switch 9. The disconnecting switch 9 is thus configured to be set from the closed state into the open state.

Figure 2:
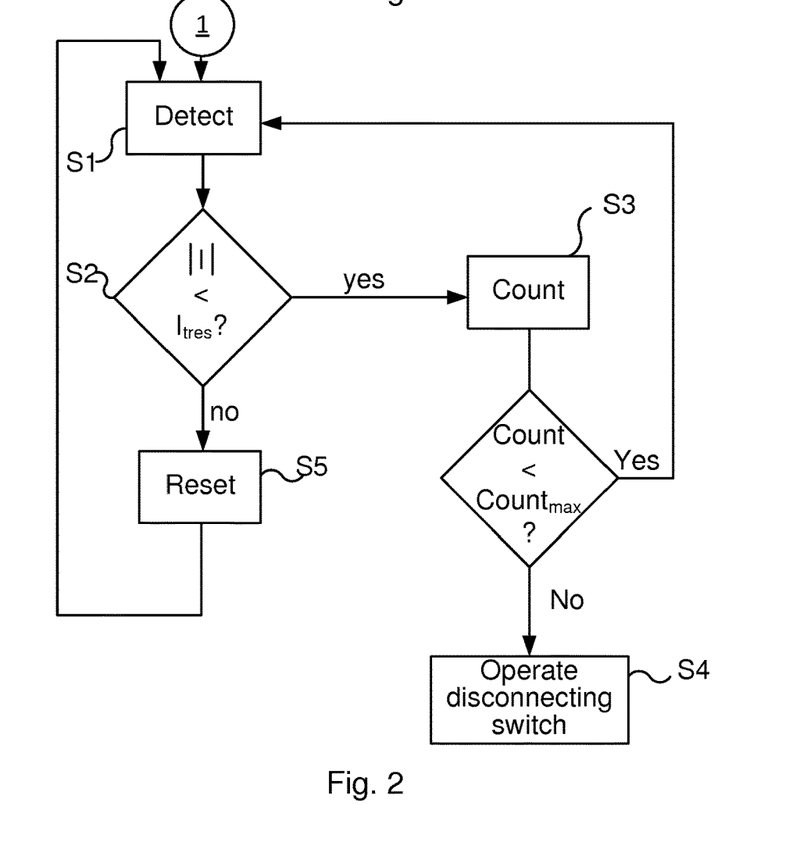
FIG. 2 schematically shows a flowchart of a method of prolonging the life of a battery of an electrically powered mobility device.

FIG. 2 shows a flowchart of a method of improving the lifetime of the battery 15, when the battery 15 is being used for powering the drive control system 16. The method is performed by the battery saving system 1.

In a step S1 the current monitoring system 3 detects a load current $I_L$ provided by the battery 15 to the drive control system 16. In particular, the current monitoring system 3 detects whether the current is a load current or a charging current, based on the sign or flow direction of the current. As noted above, in the present example, the current is the load current $I_L$.

In a step S2 it is determined whether the load current $I_L$ has a load current magnitude which exceeds or is below a load current threshold level.

In case the load current magnitude is below the load current threshold level, this is an indication that the battery 15 is not being used, i.e. that the electrically powered mobility device 13 is in an idle state.

Thus in a step S3, the timer circuit 7 counts. The timer circuit 7 may either count up or count down towards a predetermined number.

The load current magnitude is continually determined and as long as the load current magnitude is below the load current threshold level, the timer circuit 7 continues to count towards the predetermined number.

In case the timer circuit 7 reaches the predetermined number, in a step S4 the timer circuit 7 triggers the disconnecting switch 9 to be set in the open state from the closed state. The disconnecting switch 9 is hence operated to obtain its open state and the battery 15 is disconnected from the drive control system 16. The time for the counter to reach the predetermined number may for example be set to 1.5 hours.

In the example shown in FIG. 1, the timer circuit 7 contains processing circuitry configured to trigger the disconnecting switch 9 to open, i.e. to be set in the open state, in the event that the counter reaches the predetermined number. Hereto, according to this example, the timer circuit 7 may send a signal to operate the disconnecting switch 9. As an alternative, the battery saving system 1 may form part of a mobility device control system, which control system is provided with processing circuitry configured to set the disconnecting switch 9 in the open state in the event that the counter reaches the predetermined number.

In case that it is determined in step S2 that the load current $I_L$ has a load current magnitude which exceeds the load current threshold level, the counter is reset in a step S5. Thus for every iteration of step S2, the counter is reset in step S5 in case the load current magnitude exceeds the load current threshold level.

As long as the counter has not reached the predetermined number, the disconnecting switch 9 will be maintained in the closed state. Thus, as long as the load current magnitude exceeds the load current threshold level, the counter will be reset and hence unable to reach the predetermined number. It can thus be ensured that the battery 15 is connected to the drive control system 16 as long as the electrically powered mobility device 13 is in an active state.

When the disconnecting switch 9 has been set in the open state, the disconnecting switch 9 can be reset to the closed state manually by the user by means of the button 11, as previously described.

The battery saving system 1 may also be configured to prevent the battery 15 from being disconnected from a battery charger by means of the disconnecting switch 9 when the battery 15 is being charged. In particular, the battery saving system 1 may be configured to prevent the battery 15 from being disconnected as long as a battery charger intended for the battery 15 is connected to the drive control system 16 and the battery charger operates without faults.

Figure 3:
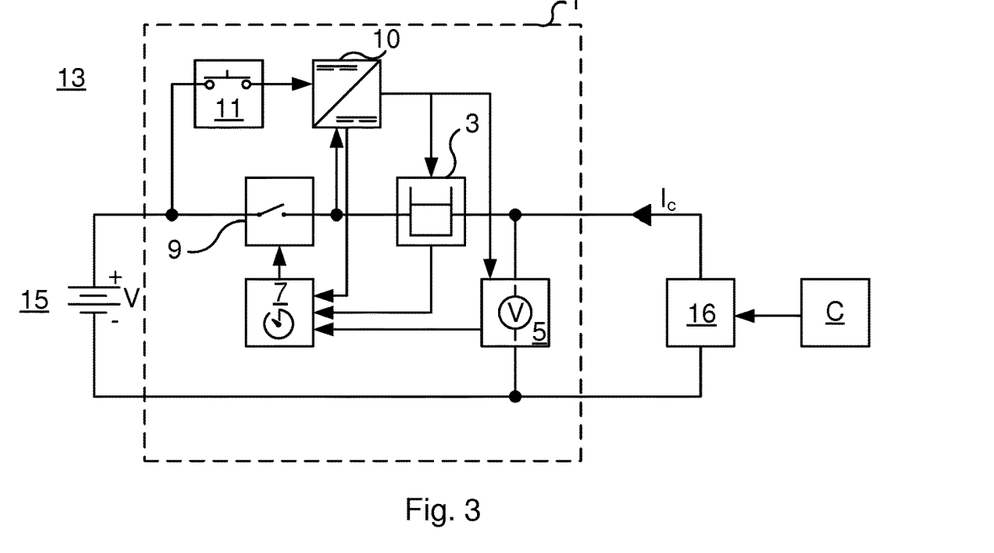
FIG. 3 schematically shows the battery saving system during charging.

FIG. 3 shows the battery saving system 1 during charging. The battery charger C may be connected to the battery 15 via the drive control system 16. During charging, the drive control system 16 may be powered by the battery charger C and not by the battery 15.

The battery charger C provides a charging current $I_C$ for charging the battery 15. The charging current $I_C$ flows in the opposite direction compared to the load current $I_L$. The current monitoring circuit 3 is configured to measure the charging current $I_C$, in particular to determine the charging current magnitude. The voltage monitoring circuit 5 is configured to measure the battery voltage V. Based on these two quantities, the counter of the timer circuit 7 is configured to be reset when correct charging is being undertaken as will be described in more detail in the following with reference to FIGS. 4 and 5.

Figure 4:
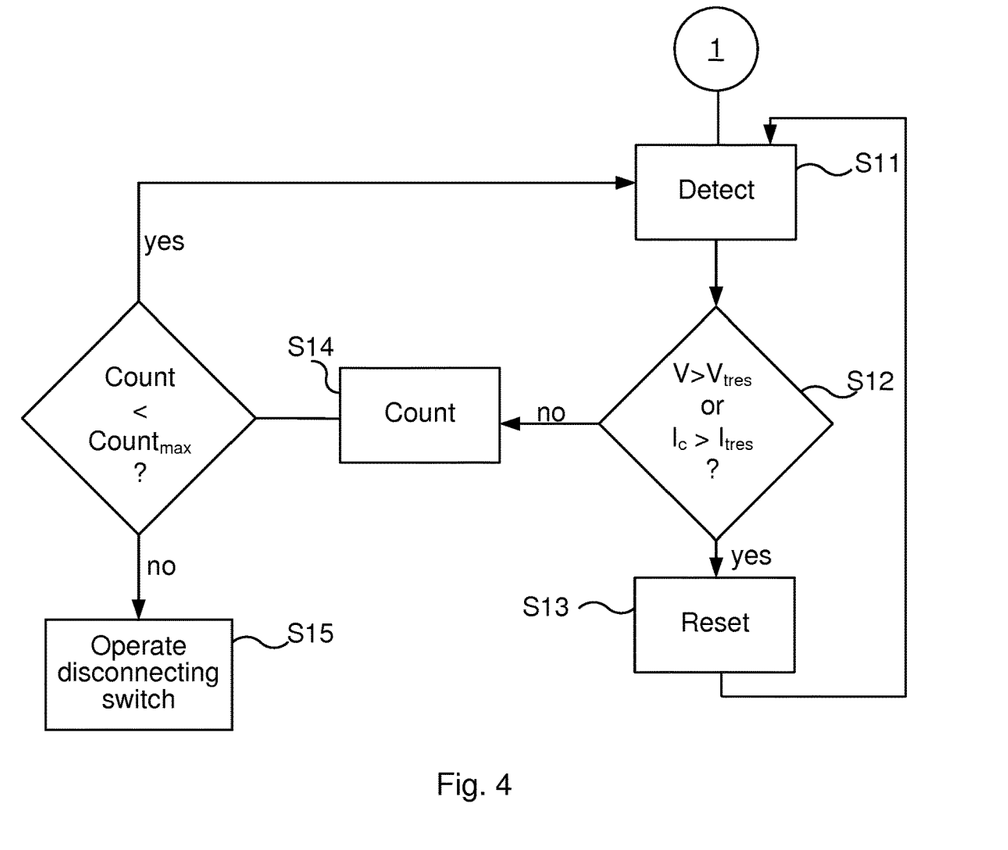
FIG. 4 schematically shows a flowchart in conjunction with battery charging.

FIG. 4 depicts a flowchart for handling charging. In a step S11 current monitoring circuit 3 detects the charging current $I_C$ and the voltage monitoring circuit 5 detects the battery voltage V.

In a step S12 it is determined whether the charging current $I_C$ is above a predetermined charging current threshold level or whether the battery voltage V is above a predetermined voltage threshold level.

In case the charging current $I_C$ or the battery voltage V is above the corresponding threshold level, the counter is reset in a step S13. Step 11 is then repeated.

In case both the charging current $I_C$ and the battery voltage V is below the corresponding threshold level, the counter counts in a step S14. In case the counter reaches the predetermined number, in a step S15, the disconnecting switch 9 is operated to be set in the open state.

Figure 5:
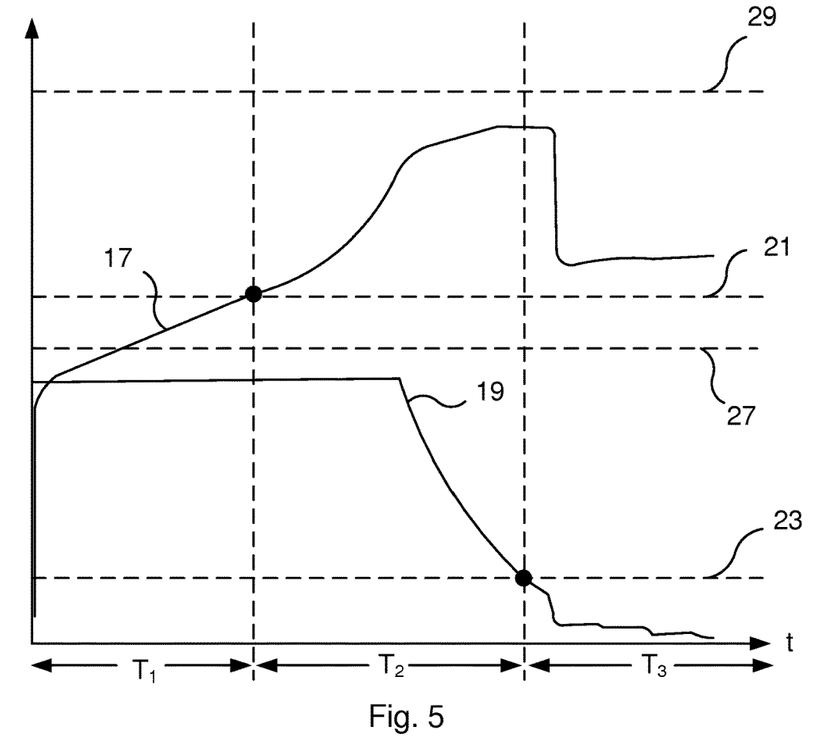
FIG. 5 schematically shows a graph with different stages during battery charging, in which the battery saving system operates.

FIG. 5 schematically depicts an example of a charging curve for the charging current $I_C$ and the battery voltage V during charging of a discharged battery 15. The voltage curve 17 shows the battery voltage V during charging. In the example, the battery voltage V is low at the commencement of charging. The charging current $I_C$ is constant as shown by the current curve 19.

Based on the sign of the current flowing in the battery circuit, it can be determined whether the battery 15 is being used in normal operation to power the drive control system 16 or whether it is being charged, and corresponding measures may be taken in order to prolong the lifetime of the battery 15.

The counter of the timer circuit 7 is configured to be reset as long as one of the battery voltage V and the charging current magnitude is above a respective predetermined voltage threshold level 21 and a predetermined charging current threshold level 23, as previously explained in conjunction with FIG. 4. For example, every time the charging current $I_C$ and the battery voltage V is measured and it is determined that at least one of the battery voltage V is above the predetermined voltage threshold level 21 and the charging current $I_C$ is above the predetermined charging current threshold level 23, the counter is reset.

According to the exemplified charging curve, during a first stage T1 the constant charging current $I_C$ is above the predetermined charging current threshold level 23, and the battery voltage V is below the predetermined voltage threshold level 21. The counter of the timer circuit 7 is hence repeatedly reset during the entire first stage T1 according to step S13. During a second stage T2 the battery voltage V is above the predetermined voltage threshold level 21 and the charging current magnitude is above the predetermined charging current threshold level 23. The counter of the timer circuit 7 is hence repeatedly reset during the entire second stage T2 according to step S13. During a third stage T3, the charging current magnitude drops below the predetermined charging current threshold level 23. The battery voltage V however maintains a value above the predetermined voltage threshold level 21, which is above the nominal voltage level of the battery 15. The counter of the timer circuit 7 is hence repeatedly reset during the entire third stage T3 according to step S13. To this end, as long as these conditions are fulfilled the battery 15 may be charged for any given amount of time without risking being disconnected from the battery charger by means of the disconnecting switch 9.

In addition or alternatively to the above, the battery saving system 1 may be configured to protect the battery 15 from high voltage and high charging currents during charging. Such a situation could for example occur in case an incorrect battery charger not compatible with the battery 15 is connected to the battery 15 for charging. Such a situation could for example occur due to user error.

Hereto, the current monitoring circuit 3 may be configured to detect if the charging current magnitude exceeds a predetermined allowed charging current level 27. The predetermined allowed charging current level 27 may for example be higher than the recommended maximum charging current of the battery 15. In case the charging current magnitude exceeds the predetermined allowed charging current level 27, the battery saving system 1 may be configured to set the disconnecting switch 9 in the open state. This disconnection is hence done irrespective of the state of the counter.

The voltage monitoring circuit 5 may be configured to detect if the battery voltage V exceeds a predetermined allowed voltage level 29. The predetermined allowed voltage level 29 is higher than the recommended maximum charging voltage of the battery 15. In case the battery voltage magnitude exceeds the predetermined allowed voltage level 29, the battery saving system 1 may be configured to set the disconnecting switch 9 in the open state. This disconnection is hence done irrespective of the state of the counter.

Figure 6:
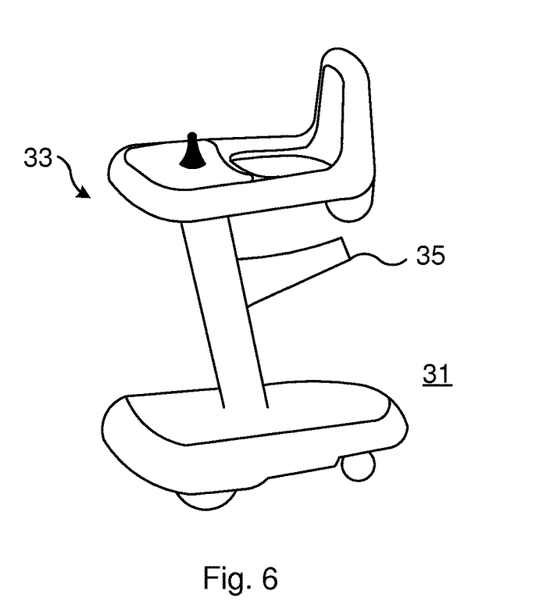
FIG. 6 schematically shows an example of an electrically powered mobility device.

FIG. 6 schematically shows an example of an electrically powered mobility device 31 comprising a seating system 33 including a seat 35. The electrically powered mobility device 31 is similar to a wheelchair. The electrically powered mobility device 31 may be specifically designed for toddlers. Such an electrically powered mobility device 31 may typically only be used relatively rarely compared to a complex power wheelchair.

The electrically powered mobility device 31 comprises an electric motor (not shown), one or more batteries (not shown), and a battery saving system 1 (not shown) configured to protect the one or more batteries.

The inventive concept has mainly been described above with reference to a few examples. However, as is readily appreciated by a person skilled in the art, other embodiments than the ones disclosed above are equally possible within the scope of the inventive concept, as defined by the appended claims.

The invention claimed is:

1. A battery saving system (1) for an electrically powered mobility device (13, 31) comprising a battery (15) and a drive control system (16) configured to be powered by the battery (15), wherein the battery saving system (1) comprises:
a current monitoring circuit (3) configured to monitor a load current ($I_L$) provided by the battery (15), wherein the current monitoring circuit (3) is configured to determine whether a load current magnitude is below a load current threshold level,
a timer circuit (7) having a counter configured to successively count as long as the load current magnitude is below the load current threshold level, and to reset the counter in the event that the load current magnitude exceeds the load current threshold level, and
a disconnecting switch (9) configured to be operated between an open state and a closed state,
wherein the timer circuit (7) is configured to trigger the disconnecting switch (9) to obtain the open state when the counter has reached a predetermined number to thereby disconnect the battery (15) from the drive control system (16).

2. The battery saving system (1) as claimed in claim 1, comprising a voltage monitoring circuit (5) configured to monitor a battery voltage (V), wherein the current monitoring circuit (3) is configured to monitor a charging current ($I_c$), and wherein the timer circuit (7) is configured to reset the counter as long as at least one of the a) battery voltage (V) is above a predetermined voltage threshold level (21) and b) a charging current magnitude is above a predetermined charging current threshold level (23).

3. The battery saving system (1) as claimed in claim 2, wherein the counter is configured to be activated when the battery voltage (V) is below the predetermined voltage threshold level (21) and the charging current magnitude is below the predetermined charging current threshold level (23).

4. The battery saving system (1) as claimed in claim 2, wherein the disconnecting switch (9) is configured to be set in the open state to disconnect the battery (15) when the charging current magnitude is above a predetermined allowed charging current level (27).

5. The battery saving system (1) as claimed in claim 4, wherein the predetermined allowed charging current level (27) is higher than the maximum recommended charging current of the battery.

6. The battery saving system (1) as claimed in claim 2, wherein the disconnecting switch (9) is configured to be set in the open state to disconnect the battery (15) when the battery voltage (V) is above a predetermined allowed voltage level (29).

7. The battery saving system (1) as claimed in claim 6, wherein the predetermined allowed voltage level (29) is higher than the maximum recommended charging battery voltage.

8. The battery saving system (1) as claimed in claim 1, comprising a button (11) configured to enable setting the disconnecting switch (9) in the closed state and to reset the counter.

9. The battery saving system (1) as claimed in claim 8, comprising a power supply (10) configured to be powered by the battery (15) and configured to power the timer circuit (7), wherein the disconnecting switch (9) is configured to disconnect the power supply (10) from the battery (15) when the disconnecting switch (9) is in the open state, and wherein the button (11) has a mechanical switch configured to be set in a closed position when the button is actuated, causing the power supply (10) to connect to the battery (15) and power the timer circuit (7).

10. A method of prolonging battery life of a battery (15) of an electrically powered mobility device (13, 31), comprising:
detecting (S1) a load current ($I_L$) from the battery (15) to a drive control system (16),
determining (S2) whether a load current magnitude is below a load current threshold level,
counting (S3) as long as the load current magnitude is below the load current threshold level,
in case the load current magnitude exceeds the load current threshold level, (S5) resetting the counter, and
operating (S4) a disconnecting switch (9) to obtain an open state when the counter reaches a predetermined number to thereby disconnect the battery (15) from the drive control system (16).

11. The method as claimed in claim 10, comprising, during charging:
(S11) detecting a battery voltage (V) and a charging current ($I_c$), p1 (S12) determining whether the battery voltage (V) is below a predetermined voltage threshold level (21) or the charging current ($I_a$) is below a predetermined charging current threshold level (23), and
resetting (S13) the counter as long as at least one of a) the battery voltage (V) is below the predetermined voltage threshold level (21) and b) the charging current ($I_c$) is below the predetermined charging current threshold level (23).

12. The method as claimed in claim 11, comprising operating the disconnecting switch (9) to obtain an open state when the charging current magnitude is above a predetermined allowed charging current level (27) to thereby disconnect the battery (15) from a battery charger (C).

13. The method as claimed in claim 11, comprising operating the disconnecting switch (9) to obtain an open state when the battery voltage (V) is above a predetermined allowed voltage level (29) to thereby disconnect the battery (15) from a battery charger (C).

14. A control system for an electrically powered mobility device (13, 31) comprising the battery saving system (1) as claimed in claim 1.

15. An electrically powered mobility device (13, 31) comprising:
   a battery (15),
   a drive control system (16), and
   a battery saving system (1) as claimed in claim 1.

\* \* \* \* \*